(12) United States Patent
Hsu

(10) Patent No.: US 7,754,538 B2
(45) Date of Patent: Jul. 13, 2010

(54) PACKAGING SUBSTRATE STRUCTURE WITH ELECTRONIC COMPONENTS EMBEDDED THEREIN AND METHOD FOR MANUFACTURING THE SAME

(75) Inventor: Shih-Ping Hsu, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 64 days.

(21) Appl. No.: 12/222,336

(22) Filed: Aug. 7, 2008

(65) Prior Publication Data

US 2009/0046432 A1    Feb. 19, 2009

(30) Foreign Application Priority Data

Aug. 15, 2007   (TW) ................................ 096130123

(51) Int. Cl.
*H01L 21/50* (2006.01)
*H01L 21/48* (2006.01)
*H01L 21/44* (2006.01)
*H01L 21/4763* (2006.01)

(52) U.S. Cl. ........................ 438/125; 438/622; 438/106

(58) Field of Classification Search ................ 438/106, 438/125, 622

See application file for complete search history.

(56) References Cited

U.S. PATENT DOCUMENTS

| | | | | |
|---|---|---|---|---|
| 7,057,290 | B2 * | 6/2006 | Sunohara et al. | 257/777 |
| 7,229,856 | B2 * | 6/2007 | Oi et al. | 438/125 |
| 7,285,862 | B2 * | 10/2007 | Sunohara et al. | 257/774 |

* cited by examiner

*Primary Examiner*—Luan C Thai
(74) *Attorney, Agent, or Firm*—Bacon & Thomas, PLLC

(57) ABSTRACT

A packaging substrate structure with electronic components embedded therein and a method for manufacturing the same are disclosed. The packaging substrate structure comprises: a core board; a built-up structure disposed on at least one surface of the core board, wherein the built-up structure has a plurality of conductive pads and an electronic component-disposing part on the surface thereof; a solder mask disposed on the surface of the built-up structure, where the solder mask has a open area to expose the electronic component-disposing part and a plurality of openings to expose the conductive pads of the built-up structure; and an electronic component disposed on the electronic component-disposing part and in the open area. Accordingly, the packaging substrate disclosed by the present invention exhibits enhanced electrical performance and product reliability.

4 Claims, 5 Drawing Sheets

PACKAGING SUBSTRATE STRUCTURE WITH ELECTRONIC COMPONENTS EMBEDDED THEREIN AND METHOD FOR MANUFACTURING THE SAME

BACKGROUND OF THE INVENTION

1. Field of the Invention

The present invention relates to a packaging substrate structure with electronic components embedded therein and a method for manufacturing the same and, more particularly, to a packaging substrate structure with electronic components embedded therein, which exhibits enhanced electrical performance and reliability, and a method for manufacturing the same.

2. Description of Related Art

As the electronic industry develops rapidly, the technology of semiconductor package accordingly moves towards integration and miniaturization so that the demands such as multifunction and high efficiency in electronic devices can be met. In addition, a semiconductor package is usually designed in a form of a multi chip module (MCM) to enhance the performance of a single semiconductor package and thus meet the demands for miniaturization, high capacity and high speed in electronic devices. Since a semiconductor package in a form of a multi chip module (MCM) has a reduced size and enhanced electrical performance, a multi chip module has become a popular package form. Furthermore, circuit boards with many active and passive components and circuit connections thereon have advanced from being single-layered boards to multiple-layered boards to expand wiring layout space in a limited circuit board and to meet the demand of the application of high-density integrated circuits.

With reference to FIG. 1, a flip chip ball grid array (FCBGA) semiconductor package is optimally applied in a high-density multi chip module, which has both a flip-chip and a ball grid array package structure. Herein, the active surface 11a of the chip 11 can be electrically connected to the surface 10a (for adhering a chip) of the packaging substrate 10 by a plurality of solder bumps 12. In addition, according to the design demand, the surface 10a (for adhering a chip) of the packaging substrate 10 can further electrically connect to at least one passive component 14, and a plurality of solder balls 15 can be disposed on the other surface of the packaging substrate 10 to function as I/O joints. The aforementioned structure has become mainstream technology for packaging chips and electronic components.

However, in a flip chip ball grid array package structure, the passive components 14 are disposed outside of the packaging substrate 10 by surface mount technology (SMT). Thereby, when a significant amount of passive components 14 are disposed on the surface of the packaging substrate 10 according to the design demand, it is necessary to increase the surface are of the packaging substrate 10 to dispose the increased passive components 14 thereon. Accordingly, the purpose for miniaturization cannot be achieved. In addition, the number of the passive components 14 is limited to the restricted area of the packaging substrate 10, and thereby the demands for high-density packaging have not been met.

Furthermore, the fact that passive components 14 are disposed on the surface of the packaging substrate 10 causes long transmission paths, large parasitic induction, poor electrical performance and thus the quality of signal transmission is badly influenced. Besides, the passive components 14 disposed on the surface of the packaging substrate 10 make the height of the package structure increase and thus the demand for a light, thin, short and small product cannot be met.

In view of the aforementioned drawbacks, many studies relative to a substrate with electronic components embedded therein have been carried out in recent years. In a conventional lamination method, high dielectric material is laminated between two copper layers and then circuits are formed to fabricate capacitors. FIG. 2 shows a cross-sectional view of a packaging substrate structure with capacitors formed therein by lamination. The method for manufacturing the same is mentioned as follows. A core board 20 having an inner wiring layer 21 comprising an inner electrode plate 211 is first provided. Then, a high dielectric material layer 22 is formed on the inner wiring layer 21, and an outer wiring layer 23 comprising an outer electrode plate 231 is formed on the surface of the high dielectric material layer 22. Accordingly, the whole of the inner electrode plate 211, the outer electrode plate 231 and the high dielectric material layer 22 therebetween can function as a capacitor 27. In addition, the inner wiring layer 21 and the outer wiring layer 23 can electrically connect with each other by plated through holes (PTH) 24. Subsequently, a solder mask 25 is formed and the solder mask 25 has a plurality of openings 251 to expose parts of the outer wiring layer 23 as conductive pads 232.

However, the prior art utilizes a whole piece of high dielectric material layer within a packaging substrate, where the used part of the high dielectric material layer for a capacitor is merely the one between the inner electrode plate and the outer electrode plate, while the unused part of the high dielectric material layer contacts with the circuits, and thereby the prior art has several drawbacks: first, the unused part of the high dielectric material layer causes waste, unfavorable to reducing the cost; second, owing to the poor fluidity and the poor machinability of the high dielectric material, voids and poor uniformity of thickness occur and the quality and capacity value of the capacitor is lowered; third, the mismatch of coefficients of thermal expansion badly influences the reliability of products; fourth, the unused part of the high dielectric material layer contacts the circuits, so that parasitic capacitance occurs which interferes with electrical qualities, such as reduced signal intensity, signal distortion, delayed response and so on; finally, because the electrode plates and the circuits are laid together in a wiring layer, the flexibility of layouts of both the electrode plates and the circuits is compromised.

SUMMARY OF THE INVENTION

In view of the aforementioned drawbacks, the present invention provides a packaging substrate structure with electronic components embedded therein, comprising: a core board; a built-up structure disposed on at least one surface of the core board, where the built-up structure comprises at least one dielectric layer, at least one wiring layer stacked on the dielectric layer and a plurality of conductive vias electrically connecting to the wiring layer, the outmost wiring layer of the built-up structure has a plurality of conductive pads, and the built-up structure has an electronic component-disposing part on the surface thereof; a solder mask disposed on the surface of the built-up structure, where the solder mask has an open area to expose the electronic component-disposing part of the built-up structure, and has a plurality of openings to expose the conductive pads of the built-up structure; and an electronic component disposed on the electronic component-disposing part in the open area, wherein the electronic component has an active surface and an inactive surface, the active surface has a plurality of electrode pads, and the inactive surface faces the electronic component-disposing part of the built-up structure.

In the aforementioned structure, preferably, the outmost wiring layer of the built-up structure has a heat sink disposed around the open area. Alternatively, the outmost wiring layer of the built-up structure can have a heat sink on the electronic component-disposing part and the inactive surface of the electronic component is attached to the heat sink. Accordingly, during the operation of the electronic component, the heat generated from the electronic component on the electronic component-disposing part can be efficiently dissipated through the heat sink so as to enhance the performance and lifetime of the electronic component.

The present invention further provides a method for manufacturing a packaging substrate structure with electronic components embedded therein, comprising: providing a core board; forming a built-up structure on at least one surface of the core board, where the built-up structure comprises at least one dielectric layer, at least one wiring layer stacked on the dielectric layer, and a plurality of conductive vias electrically connecting to the wiring layer, the built-up structure has an electronic component-disposing part on the surface thereof, and the outmost wiring layer of the built-up structure has a plurality of conductive pads and a metal block on the electronic component-disposing part; forming a solder mask on the surface of the built-up structure, wherein a plurality of openings are formed in the solder mask to expose the conductive pads of the built-up structure, also a first open area is formed in the solder mask to expose the metal block, and a second open area is formed by etching the metal block; and placing an electronic component in the first and second open areas, wherein the electronic component has an active surface and an inactive surface, the active surface has a plurality of electrode pads, and the inactive surface faces the electronic component-disposing part of the built-up structure.

In the aforementioned method, preferably, the exposed part of the metal block is etched to form the second open area while the unexposed part of the metal block is used as a heat sink around the second open area. Alternatively, after the first open area is formed to expose the metal block, the inactive surface of the electronic component is directly attached to the exposed metal block, so that a packaging substrate structure where the electronic component is directly attached to the heat sink is provided.

In addition, the present invention further provides another method for manufacturing a packaging substrate structure with electronic components embedded therein, comprising: providing a core board; forming a built-up structure on at least one surface of the core board, where the built-up structure comprises at least one dielectric layer, at least one wiring layer stacked on the dielectric layer, and a plurality of conductive vias electrically connecting to the wiring layer, the outmost wiring layer of the built-up structure has a plurality of conductive pads, also the built-up structure has an electronic component-disposing part on the surface thereof, and the electronic component-disposing part is a partial surface of the outmost dielectric layer of the built-up structure; placing an electronic component on the electronic component-disposing part of the built-up structure, where the electronic component has an active surface and an inactive surface, the active surface has a plurality of electrode pads, and the inactive surface faces the electronic component-disposing part of the built-up structure; and forming a solder mask on the surface of the built-up structure, wherein the solder mask has an open area to expose the active surface of the electronic component and a plurality of openings to expose the conductive pads of the built-up structure.

In the aforementioned method, preferably, the outmost wiring layer of the built-up structure has a heat sink around the open area, so that a packaging substrate structure where a heat sink surrounds the electronic component-disposing part is provided.

In the packaging substrate structure and the method for manufacturing the same according to the present invention, an adhesive layer can be disposed between the inactive surface of the electronic component and the electronic component-disposing part of the built-up structure so that the electronic component can be fixed on the electronic component-disposing part through the adhesive layer.

In the packaging substrate structure and the method for manufacturing the same according to the present invention, the gap between the open area and the electronic component can be filled with an adhesive material to fix the electronic component.

In the packaging substrate structure and the method for manufacturing the same according to the present invention, solder bumps can be formed on the conductive pads and the electrode pads so as to electrically connect the packaging substrate structure with other electronic components. For example, the electronic component can be a passive component, and the electrode pads electrically connect to an IC chip through solder bumps so as to reduce the transmission path and enhance the electric performance.

Accordingly, in the packaging substrate structure with electronic components embedded therein and the method for manufacturing the same according to the present invention, since the electronic component is embedded in the built-up structure, it is possible to enhance the flexibility of wiring layout, reduce the package size and the transmission path and thus enhance the electrical performance. In addition, no high dielectric material is used in the packaging substrate structure of the present invention, and thereby the disadvantages of the prior art where a passive component is formed by laminating a high dielectric material can be avoided.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
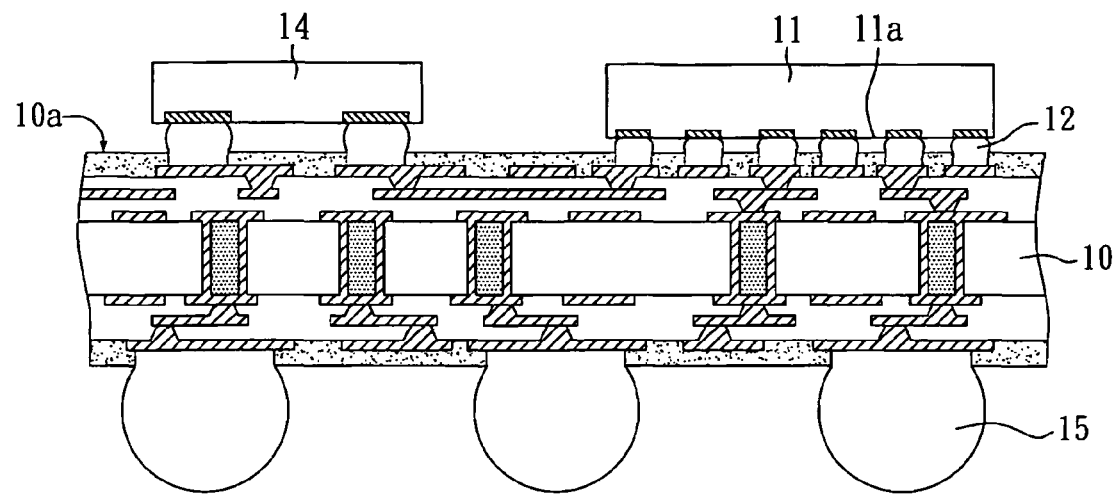
FIG. 1 is a cross-sectional view of a conventional packaging substrate structure where electronic components are disposed by surface mount technology.
Figure 2:
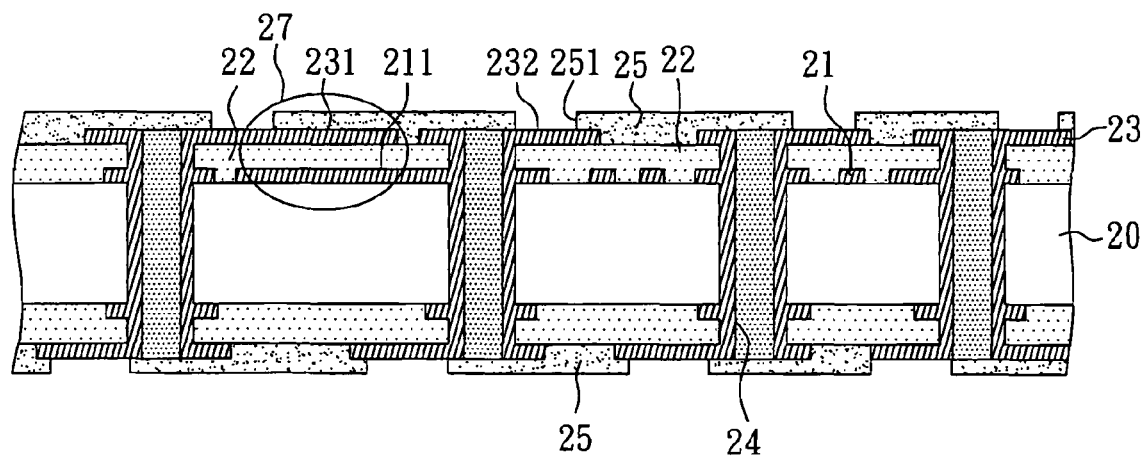
FIG. 2 is a cross-sectional view of a conventional packaging substrate structure with capacitors formed by lamination.

Because the specific embodiments illustrate the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements exposed in the drawings are not necessarily aspects of the practice, and quantity and shape thereof are optionally designed. Further, the design aspect of the elements can be more complex.

Embodiment 1

With reference to FIGS. 3A to 3D, there is shown a process for manufacturing a packaging substrate structure with electronic components embedded therein of the present embodiment.

Figure 3A:
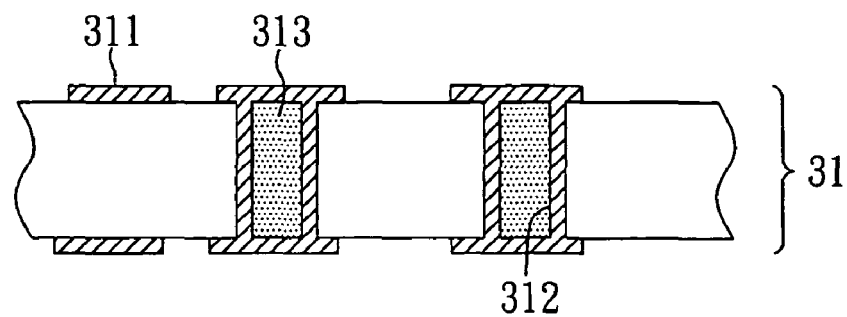
FIGS. 3A to 3D are cross-sectional views for illustrating a process for manufacturing a packaging substrate structure with electronic components embedded therein of a preferred embodiment of the present invention.

As shown in FIG. 3A, a core board 31 is first provided. Herein, the core board 31 has an inner wiring layer 311 on both surfaces thereof and plated through holes 312 penetrating the core board 31 and electrically connecting the circuits on both sides of the core board 31. In the present embodiment, the plated through holes 312 can be filled with an insulating resin 313 or metal (not shown in the figures).

Figure 3B:
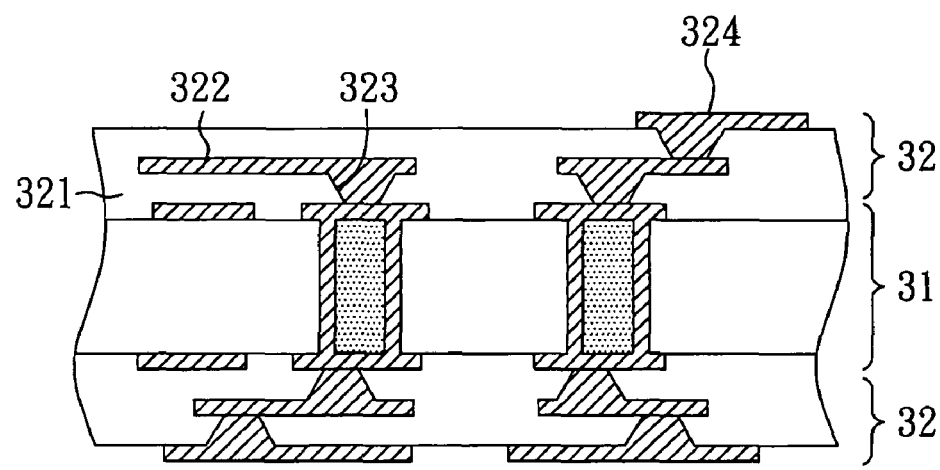

Subsequently, as shown in FIG. 3B, a built-up structure 32 is formed on both surfaces of the core board 31. Herein, the built-up structure 32 comprises at least one dielectric layer 321, at least one wiring layer 322 stacked on the dielectric layer 321, and a plurality of conductive vias 323 electrically connecting to the wiring layer, and the outmost wiring layer 322 of the built-up structure 32 has a plurality of conductive pads 324.

Figure 3C:
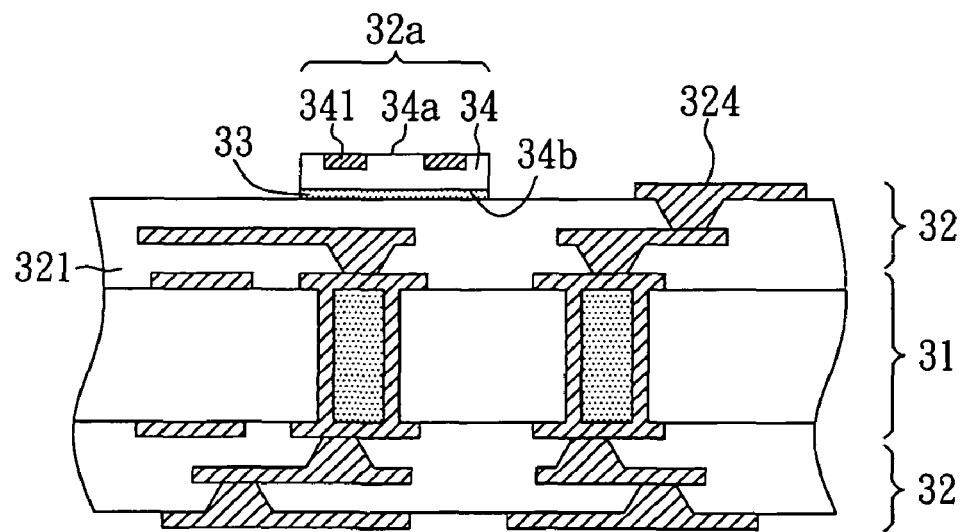

As shown in FIG. 3C, an adhesive layer 33 is formed on a partial surface of the outmost dielectric layer 321 of the built-up structure 32. Herein, the location on which the adhesive layer 33 is formed is defined as an electronic component-disposing part 32a of the built-up structure 32. Subsequently, an electronic component 34 is fixed on the electronic component-disposing part 32a by the adhesive layer 33. Herein, the electronic component 34 can be a passive component or an active component, which has an active surface 34a and an inactive surface 34b. The active surface 34a of the electronic component 34 has a plurality of electrode pads 341, and the inactive surface 34b of the electronic component 34 faces the electronic component-disposing part 32a of the built-up structure 32.

Figure 3D:
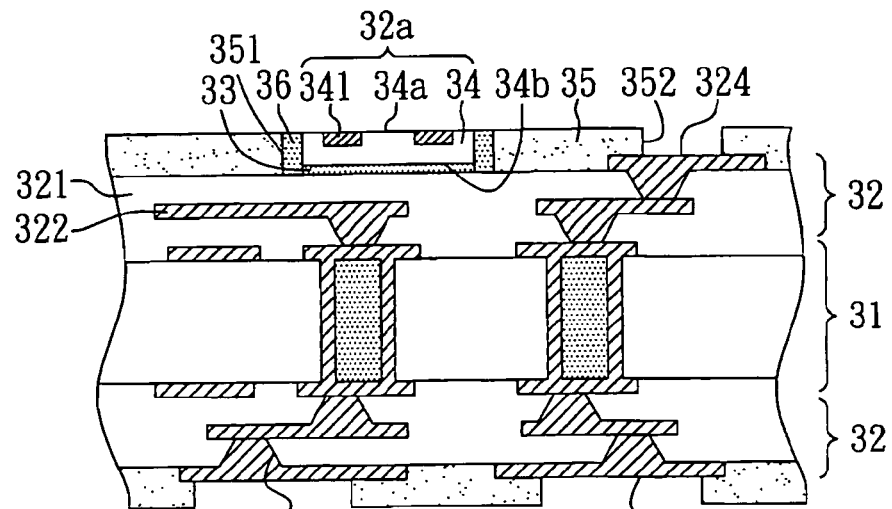

Next, as shown in FIG. 3D, a solder mask 35 is formed on the surface of the built-up structure 32, and an open area 351 is formed in the solder mask 35 to expose the active surface 34a of the electronic component 34. In addition, a plurality of openings 352 is formed in the solder mask 35 to expose the conductive pads 324. Herein, the gap between the open area 351 and the electronic component 34 is filled with an adhesive material 36 to fix the electronic component 34.

Finally, solder bumps (not shown in the figures) can be formed on the conductive pads 324 and the electrode pads 341 so as to electrically connect to IC chips and other electronic components.

As shown in FIG. 3D, the present embodiment further provides a packaging substrate structure with electronic components embedded therein, comprising: a core board 31; a built-up structure 32 disposed on both surfaces of the core board 31, where the built-up structure 32 comprises at least one dielectric layer 321, at least one wiring layer 322 stacked on the dielectric layer 321, and a plurality of conductive vias 323 electrically connecting to the wiring layer, the outmost wiring layer 322 of the built-up structure 32 has a plurality of conductive pads 324, and the built-up structure 32 has an electronic component-disposing part 32a on the surface thereof; a solder mask 32 disposed on the surface of the built-up structure 32, wherein the solder mask 35 has an open area 351 to expose the electronic component-disposing part 32a of the built-up structure 32 and a plurality of openings 352 to expose the conductive pads 324 of the built-up structure 32; and an electronic component 34 disposed on the electronic component-disposing part 32a in the open area 351 by an adhesive layer 33, wherein the gap between the open area 351 and the electronic component 34 is filled with an adhesive material 36 to fix the electronic component 34, the electronic component 34 has an active surface 34a and an inactive surface 34b, the active surface 34a has a plurality of electrode pads 341, and the inactive surface 34b faces the electronic component-disposing part 32a of the built-up structure 32.

Embodiment 2

The process for manufacturing a packaging substrate structure with electronic components therein in the present embodiment is the same as that in Embodiment 1, except that the outmost wiring layer of the built-up structure has a heat sink.

Figure 3E:
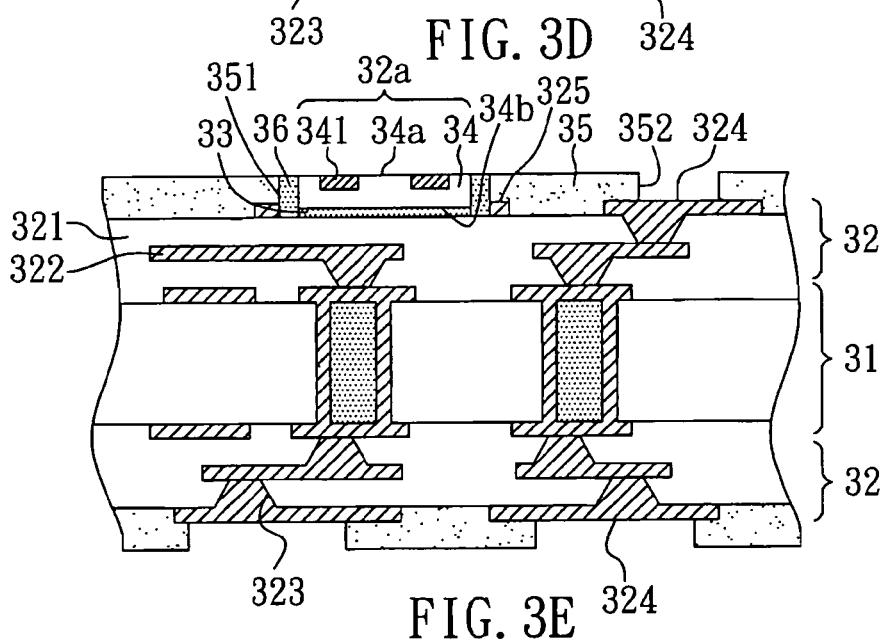
FIGS. 3E and 3F are cross-sectional views of packaging substrate structures with electronic components embedded therein of other preferred embodiments of the present invention.
Figure 3F:
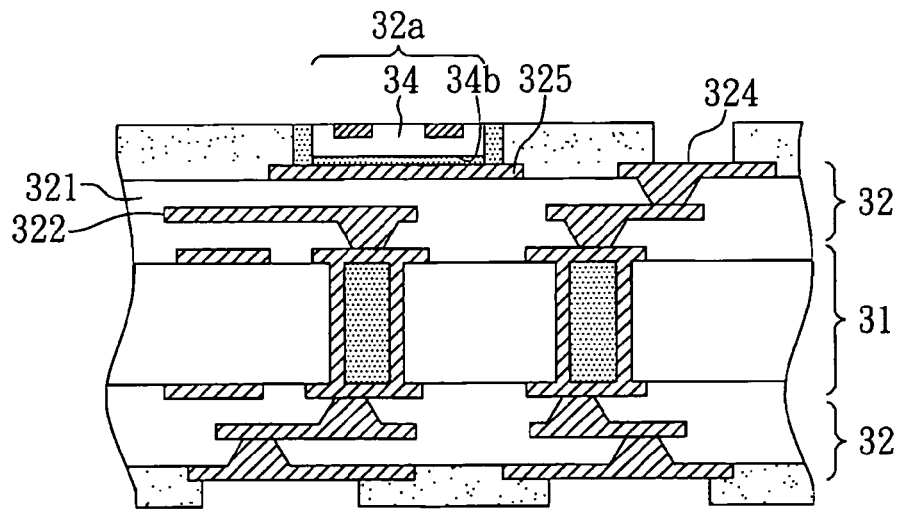

With reference to FIG. 3E, the heat sink 325 around the open area 351 and the outmost wiring layer 322 of the built-up structure 32 are formed together. Alternatively, with reference to FIG. 3F, while the outmost wiring layer 322 of the built-up structure 32 is being formed, the heat sink 325 is formed simultaneously on the electronic component-disposing part 32a. Herein, the inactive surface 34b of the electronic component 34 is attached to the surface of the heat sink 325. Accordingly, during the operation of the electronic component 34, the heat generated from the electronic component 34 on the electronic component-disposing part 32a can be efficiently dissipated through the heat sink 325 of the present embodiment.

Embodiment 3

With reference to FIGS. 4A to 4E, there is shown a process for manufacturing a packaging substrate structure with electronic components embedded therein of the present embodiment.

Figure 4A:
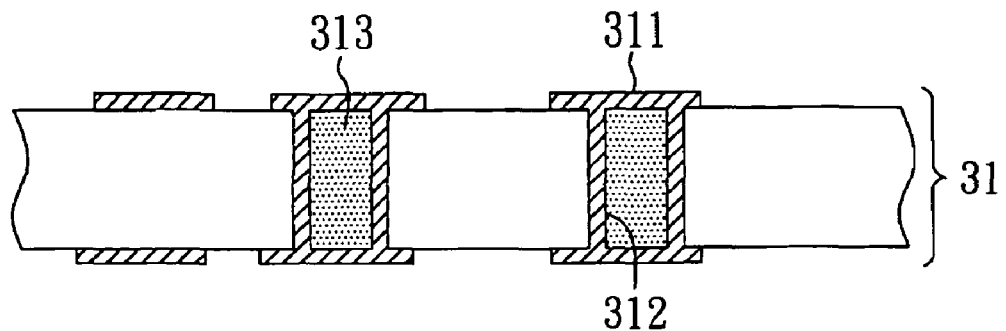
FIGS. 4A to 4E are cross-sectional views for illustrating a process for manufacturing a packaging substrate structure with electronic components embedded therein of another preferred embodiment of the present invention.

As shown in FIG. 4A, a core board 31 is first provided. Herein, the core board 31 has an inner wiring layer 311 on both surfaces thereof and plated through holes 312 penetrating the core board 31 and electrically connecting the circuits on both sides of the core board 31. In the present embodiment, the plated through holes 312 can be filled with an insulating resin 313 or metal (not shown in the figures).

Figure 4B:
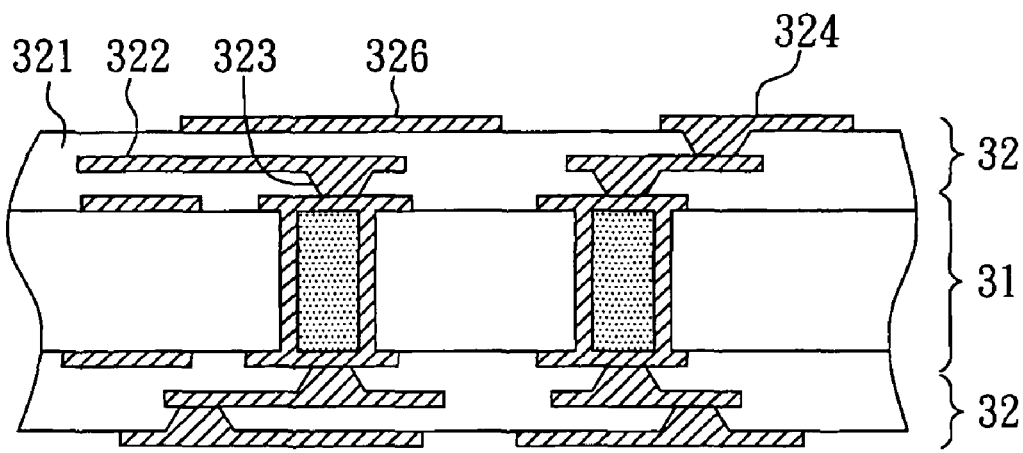

Subsequently, as shown in FIG. 4B, a built-up structure 32 is formed on both surfaces of the core board 31. Herein, the built-up structure 32 comprises at least one dielectric layer 321, at least one wiring layer 322 stacked on the dielectric layer 321 and a plurality of conductive vias 323 electrically connecting to the wiring layer, and the outmost wiring layer 322 of the built-up structure 32 has a plurality of conductive pads 324 and a metal block 326.

Figure 4C:
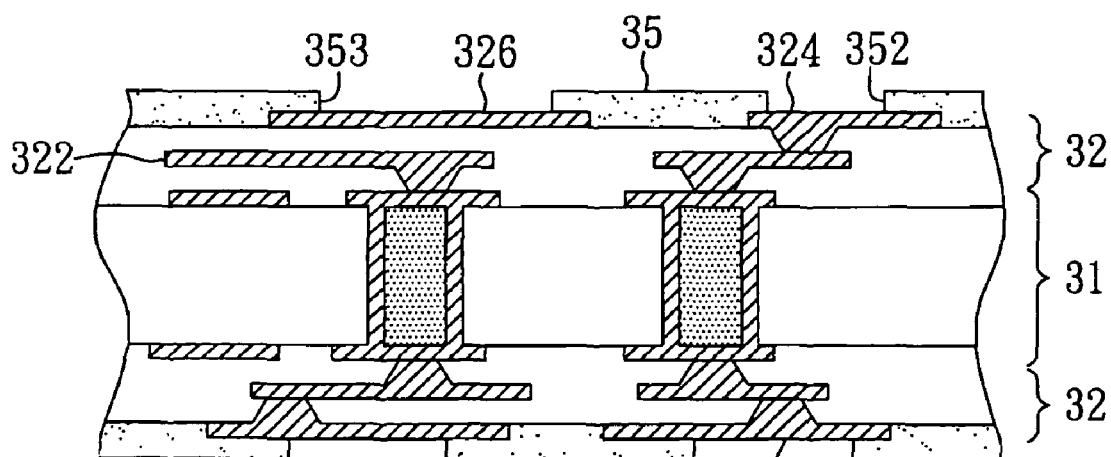

As shown in FIG. 4C, a solder mask 35 is formed on the surface of the built-up structure 32, and a plurality of openings 352 is formed in the solder mask 35 to expose the conductive pads 324 of the built-up structure 32. In addition, a first open area 353 is formed in the solder mask 35 to expose the metal block 326.

Figure 4D:
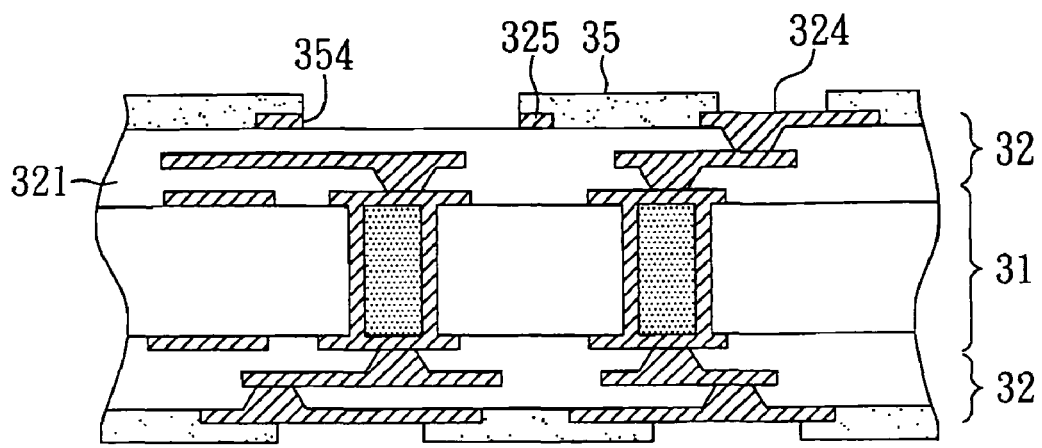
Figure 4E:
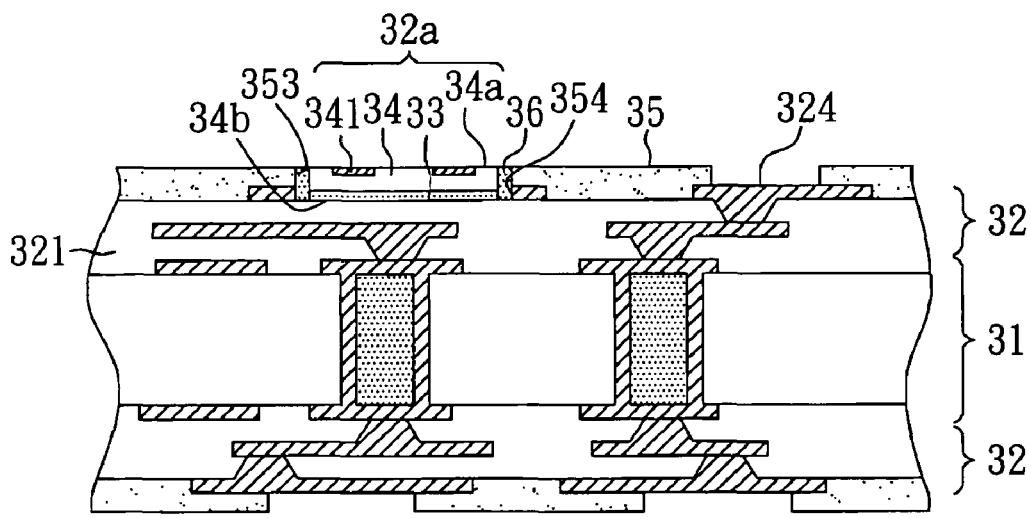

Next, as shown in FIG. 4D, the exposed metal block is etched to form a second open area 354, and the metal block around the second open area 354 is used as a heat sink 325. Subsequently, as shown in FIG. 4E, an adhesive layer 33 is formed on a partial surface of the dielectric layer 321 exposed in the first and second open areas 353, 354. Herein, the location on which the adhesive layer 33 is formed is defined as an electronic component-disposing part 32a of the built-up structure 32. Then, an electronic component 34 is disposed on the electronic component-disposing part 32a by the adhesive layer 33. In addition, the gap between the electronic component 34 and the first and second open areas 353, 354 is filled with an adhesive material 36 to fix the electronic component 34. Herein, the electronic component 34 can be a passive component or an active component, which has an active surface 34a and an inactive surface 34b. The active surface 34a of the electronic component 34 has a plurality of electrode pads 341, and the inactive surface 34b of the electronic component 34 faces the electronic component-disposing part 32a of the built-up structure 32.

Finally, solder bumps (not shown in the figures) can be formed on the conductive pads 324 and the electrode pads 341 so as to electrically connect to IC chips and other electronic components.

Embodiment 4

Figure 4F:
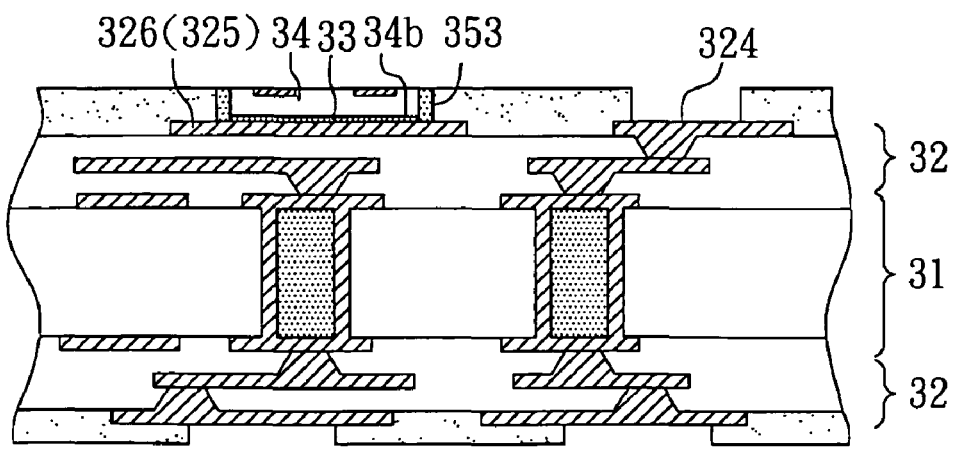
FIG. 4F is a cross-sectional view of a packaging substrate structures with electronic components embedded therein of another preferred embodiment of the present invention.

The process for manufacturing a packaging substrate structure with electronic components therein in the present embodiment is the same as that in Embodiment 3, except that the inactive surface 34b of the electronic component 34 is directly attached to the exposed metal block 326 by the adhesive layer 33 after the first open area 353 is formed to expose the metal block 326, as shown in FIG. 4F. Herein, the metal block 326 is used as a heat sink 325. Accordingly, a packaging substrate structure with a heat sink formed on an electronic component-disposing part is provided.

In the packaging substrate structure with electronic components embedded therein and the method for manufacturing the same according to the present invention, since the electronic component is embedded in the built-up structure, it is possible to enhance the flexibility of wiring layout, reduce the package size and the transmission path and thus enhance the electrical performance. In addition, no high dielectric material is used in the packaging substrate structure of the present invention, and thereby the disadvantages of the prior art where a passive component is formed by laminating a high dielectric material can be avoided.

Although the present invention has been explained in relation to its preferred embodiment, it is to be understood that many other possible modifications and variations can be made without departing from the scope of the invention as hereinafter claimed.

What is claimed is:

1. A method for manufacturing a packaging substrate structure with electronic components embedded therein, comprising:
    providing a core board;
    forming a built-up structure on at least one surface of the core board, wherein the built-up structure comprises at least one dielectric layer, at least one wiring layer stacked on the dielectric layer, and a plurality of conductive vias electrically connecting to the wiring layer, the built-up structure has an electronic component-disposing part on the surface thereof, and the outmost wiring layer of the built-up structure has a plurality of conductive pads and a metal block on the electronic component-disposing part;
    forming a solder mask on the surface of the built-up structure, wherein a plurality of openings are formed in the solder mask to expose the conductive pads of the built-up structure, also a first open area is formed in the solder mask to expose the metal block, and a second open area is formed by etching the metal block; and
    placing an electronic component in the first and second open areas, wherein the electronic component has an active surface and an inactive surface, the active surface has a plurality of electrode pads, and the inactive surface faces the electronic component-disposing part of the built-up structure.

2. The method as claimed in claim 1, wherein the exposed part of the metal block is etched to form the second open area while the unexposed part of the metal block is used as a heat sink around the second open area.

3. The method as claimed in claim 1, wherein the inactive surface of the electronic component is attached to the electronic component-disposing part of the built-up structure through an adhesive layer.

4. The method as claimed in claim 1, further comprising filling a gap between the first and second open areas and the electronic component with an adhesive material to fix the electronic component.

* * * * *